United States Patent
Hourtane et al.

(10) Patent No.: US 11,916,722 B2
(45) Date of Patent: *Feb. 27, 2024

(54) SYSTEM AND METHOD FOR RESILIENT WIRELESS PACKET COMMUNICATIONS

(71) Applicant: Aviat U.S., Inc., Austin, TX (US)

(72) Inventors: Alain Hourtane, San Francisco, CA (US); Sergio Licardie, Cupertino, CA (US); Chaoming Zeng, Milpitas, CA (US)

(73) Assignee: Aviat U.S., Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/097,089

(22) Filed: Jan. 13, 2023

(65) Prior Publication Data

US 2023/0231758 A1 Jul. 20, 2023

Related U.S. Application Data

(63) Continuation of application No. 17/516,213, filed on Nov. 1, 2021, now Pat. No. 11,570,036, which is a
(Continued)

(51) Int. Cl.
*H04L 41/0604* (2022.01)
*H04L 12/42* (2006.01)
(Continued)

(52) U.S. Cl.
CPC ........ *H04L 41/0627* (2013.01); *H03M 13/09* (2013.01); *H04L 1/004* (2013.01);
(Continued)

(58) Field of Classification Search
None
See application file for complete search history.

(56) References Cited

U.S. PATENT DOCUMENTS

| 4,941,089 A | 7/1990 | Fischer |
| 6,434,165 B1 | 8/2002 | Sherer et al. |

(Continued)

FOREIGN PATENT DOCUMENTS

| CN | 1848767 | 10/2006 |
| CN | 1949724 | 4/2007 |
| WO | 0072531 | 11/2000 |

OTHER PUBLICATIONS

Brown Andrew, "IEEE 802.17 Resilient Packet Ring (RPR) Standards Update," 27th Meeting of the North American Network Operators' Group (NANOG), Feb. 2003.
(Continued)

*Primary Examiner* — Mohammad S Adhami
(74) *Attorney, Agent, or Firm* — Pillsbury Winthrop Shaw Pittman LLP

(57) ABSTRACT

Rapid failure detection and recovery in wireless communication networks is needed in order to meet, among other things, carrier class Ethernet transport channel standards. Thus, resilient wireless packet communications is provided using a hardware-assisted rapid transport channel failure detection algorithm and a Gigabit Ethernet data access card with an engine configured accordingly. In networks with various topologies, this is provided in combination with their existing protocols, such as rapid spanning tree and link aggregation protocols, respectively.

20 Claims, 15 Drawing Sheets

Failure Detection and Recovery Flow Chart

Related U.S. Application Data continuation of application No. 16/702,386, filed on Dec. 3, 2019, now Pat. No. 11,165,630, which is a continuation of application No. 16/150,192, filed on Oct. 2, 2018, now Pat. No. 10,498,584, which is a continuation of application No. 15/653,485, filed on Jul. 18, 2017, now Pat. No. 10,091,051, which is a continuation of application No. 14/611,534, filed on Feb. 2, 2015, now Pat. No. 9,712,378, which is a continuation of application No. 14/183,376, filed on Feb. 18, 2014, now Pat. No. 8,988,981, which is a continuation of application No. 11/351,983, filed on Feb. 10, 2006, now Pat. No. 8,693,308.

(51) Int. Cl.
| | |
|---|---|
| H04L 41/0663 | (2022.01) |
| H04L 45/00 | (2022.01) |
| H04L 45/28 | (2022.01) |
| H04L 1/00 | (2006.01) |
| H03M 13/09 | (2006.01) |
| H04W 24/04 | (2009.01) |
| H04L 41/0654 | (2022.01) |

(52) U.S. Cl.
CPC .......... *H04L 12/42* (2013.01); *H04L 41/0654* (2013.01); *H04L 41/0663* (2013.01); *H04L 45/00* (2013.01); *H04L 45/28* (2013.01); *H04W 24/04* (2013.01)

(56) References Cited

U.S. PATENT DOCUMENTS

| | | | |
|---|---|---|---|
| 6,501,749 | B1 | 12/2002 | Alexander, Jr. et al. |
| 6,512,742 | B1 | 1/2003 | Alexander, Jr. et al. |
| 6,535,489 | B1 | 3/2003 | Merchant et al. |
| 6,625,152 | B1 | 9/2003 | Monsen et al. |
| 6,675,243 | B1 | 1/2004 | Bastiani et al. |
| 6,850,486 | B2 | 2/2005 | Saleh et al. |
| 6,901,048 | B1 | 5/2005 | Wang et al. |
| 6,910,149 | B2 | 6/2005 | Perloff et al. |
| 6,928,056 | B2 | 8/2005 | Evans |
| 6,952,401 | B1 | 10/2005 | Kadambi et al. |
| 7,006,500 | B1 | 2/2006 | Pedersen et al. |
| 7,010,607 | B1 | 3/2006 | Bunton |
| 7,023,797 | B2 | 4/2006 | Tagore-Brage |
| 7,145,866 | B1 | 12/2006 | Ting et al. |
| 7,230,925 | B2 | 6/2007 | Li et al. |
| 7,266,079 | B2 | 9/2007 | Fan |
| 7,529,180 | B1 | 5/2009 | Karl et al. |
| 7,551,616 | B2 | 6/2009 | Devi et al. |
| 7,613,110 | B1 | 11/2009 | Blair |
| 7,639,614 | B2 | 12/2009 | Nakagawa et al. |
| 7,787,370 | B1 | 8/2010 | Aweya et al. |
| 7,804,761 | B2 | 9/2010 | Rosenhouse et al. |
| 7,876,747 | B2 | 1/2011 | Elangovan et al. |
| 7,898,959 | B1 | 3/2011 | Arad |
| 7,911,953 | B1 | 3/2011 | Prestor et al. |
| 8,018,843 | B2 | 9/2011 | Dunbar et al. |
| 8,094,559 | B1 | 1/2012 | Bly et al. |
| 8,264,953 | B2 | 9/2012 | Licardie et al. |
| 8,693,308 | B2 | 4/2014 | Hourtane et al. |
| 8,774,000 | B2 | 7/2014 | Licardie et al. |
| 9,712,378 | B2 | 7/2017 | Hourtane |
| 9,929,900 | B2 | 3/2018 | Licardie et al. |
| 10,091,051 | B2 | 10/2018 | Hourtane et al. |
| 10,164,874 | B2 | 12/2018 | Licardie et al. |
| 10,498,584 | B2 | 12/2019 | Hourtane et al. |
| 10,505,841 | B1 | 12/2019 | Licardie et al. |
| 11,165,630 | B2 | 11/2021 | Hourtane et al. |
| 2002/0054567 | A1 | 5/2002 | Fan |
| 2002/0097681 | A1* | 7/2002 | Treister ............... H04W 84/20 370/386 |
| 2002/0105949 | A1 | 8/2002 | Shinomiya et al. |
| 2002/0136268 | A1* | 9/2002 | Gan ................. H04W 72/542 375/133 |
| 2002/0159023 | A1 | 10/2002 | Swab |
| 2002/0167898 | A1 | 11/2002 | Thang et al. |
| 2003/0054829 | A1 | 3/2003 | Moisio |
| 2003/0117945 | A1 | 6/2003 | Zboril |
| 2003/0128706 | A1 | 7/2003 | Mark et al. |
| 2004/0085894 | A1 | 5/2004 | Wang et al. |
| 2004/0208552 | A1 | 10/2004 | Harney et al. |
| 2004/0228278 | A1 | 11/2004 | Bruckman et al. |
| 2005/0063701 | A1 | 3/2005 | Ovadia et al. |
| 2005/0152369 | A1 | 7/2005 | Ambe et al. |
| 2005/0157759 | A1 | 7/2005 | Ohno et al. |
| 2005/0169294 | A1 | 8/2005 | Tseng et al. |
| 2005/0193309 | A1 | 9/2005 | Grilli et al. |
| 2005/0213547 | A1 | 9/2005 | Meier |
| 2005/0281204 | A1 | 12/2005 | Karol et al. |
| 2005/0281220 | A1 | 12/2005 | Stanwood et al. |
| 2006/0031482 | A1 | 2/2006 | Mohan et al. |
| 2006/0045031 | A1* | 3/2006 | Hickey ................ H04L 25/14 370/266 |
| 2006/0098573 | A1 | 5/2006 | Beer et al. |
| 2006/0159023 | A1* | 7/2006 | Hickey ................ H04L 47/32 370/241 |
| 2006/0203780 | A1* | 9/2006 | Terry .................. H04L 1/1812 370/335 |
| 2006/0203847 | A1 | 9/2006 | Toyoda |
| 2006/0221974 | A1 | 10/2006 | Hilla et al. |
| 2006/0251106 | A1 | 11/2006 | Nakagawa et al. |
| 2007/0189154 | A1 | 8/2007 | Hourtane et al. |
| 2007/0237172 | A1 | 10/2007 | Zelig et al. |
| 2007/0280258 | A1 | 12/2007 | Rajagopalan et al. |
| 2008/0068983 | A1 | 3/2008 | Dunbar et al. |
| 2008/0291843 | A1 | 11/2008 | Sonnenberg et al. |
| 2008/0305743 | A1 | 12/2008 | Aithal et al. |
| 2010/0142560 | A1 | 6/2010 | Sharivker et al. |
| 2010/0215058 | A1 | 8/2010 | Yakov et al. |

OTHER PUBLICATIONS

Cisco Systems, Inc., "Understanding Rapid Spanning Tree Protocol (802.1w)," white paper, Document ID: 24062, pp. 1-19, Sep. 1, 2005.
IEEE Computer Society, "IEEE Standard for Information Technology—Telecommunications and Information Exchange Between Systems—Local and Metropolitan Area Networks—Specific Requirements—Part 3: Carrier Sense Multiple Access with Collision Detection (CSMA/CD) Access Method and Physical Layer Specifications," ISBN 978-0-7381-4740-6, Section 43, pp. 285-349, Jan. 1, 2005.
Light Reading Inc., "Making Sonet Ethernet-Friendly," Mar. 25, 2003 [retrieved online at http://www.lightreading.com/document.asp?doc_id=30194 on Aug. 14, 2007].
SysKonnect GmbH, "Link Aggregation According to IEEE Standard 802.3ad," white paper, v. 1.10, Oct. 10, 2002.
European Patent Application Serial No. 087958674, Search Report dated Oct. 25, 2010.
European Patent Application Serial No. 088297049, Search Report dated Jan. 3, 2012.
International Application No. PCT/US2006/006722, International Search Report and Written Opinion dated Sep. 21, 2007.
International Application No. PCT/US2008/064600, International Search Report and Written Opinion dated Jul. 28, 2008.
International Application No. PCT/US2008/075618, International Search Report and Written Opinion dated Nov. 24, 2008.

* cited by examiner

RING HEALING (PRIOR ART)     Bidirectional Dual Transport Channel Packet Processing

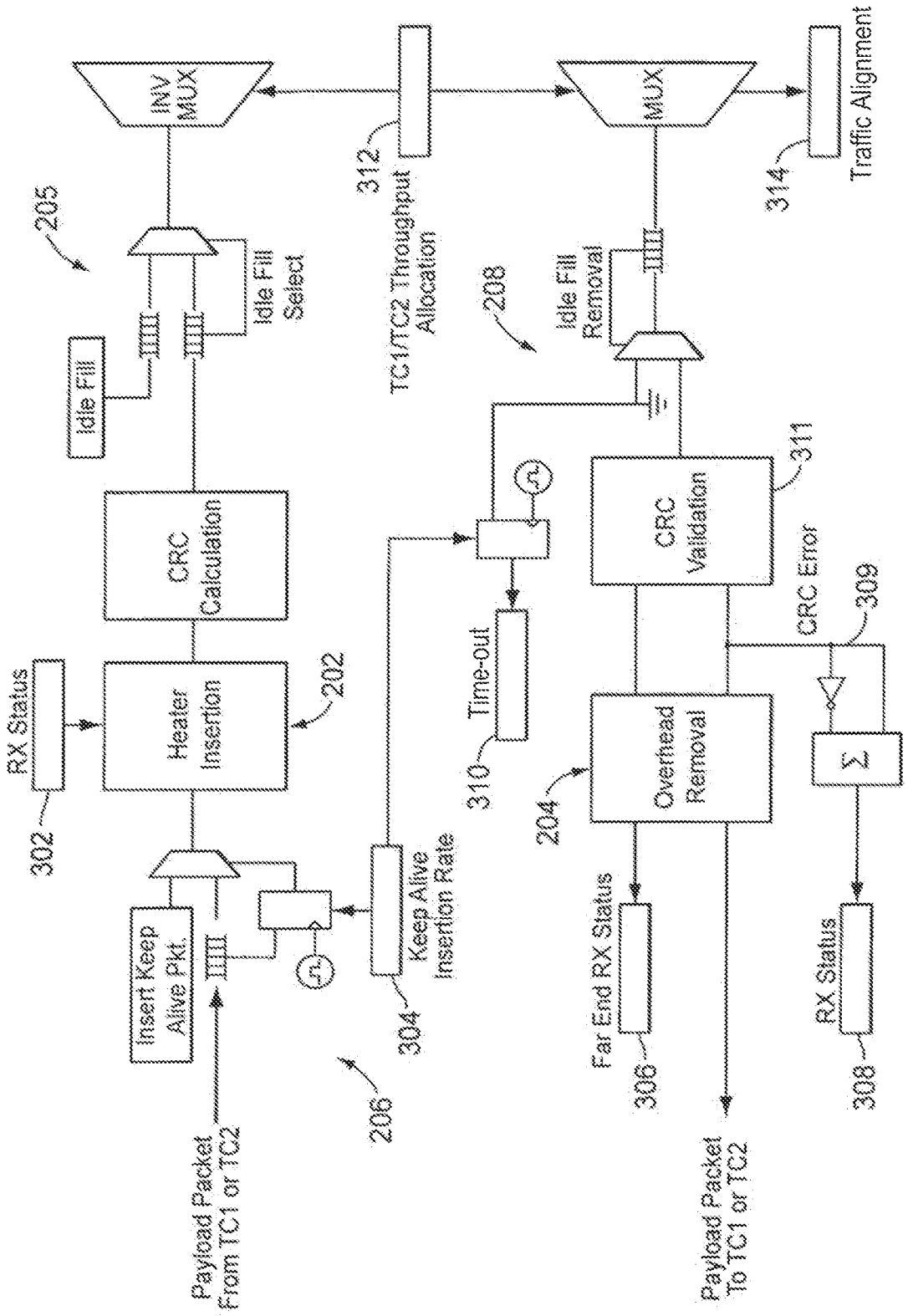
FIG. 4A   Modified Transport Channel Packet Processing in FPGA-based Processing Engine

| Transport Channel Capacity | Average Packet Length | % Utilization | Average Packet Arrival Rate | Keep Alive Packet Insertion Rate | CRC Error Threshold | Failure Detection Latency |
|---|---|---|---|---|---|---|
| 155 Mbps | 5000 bytes | 75% | 344 µs | 500 µs | 10 | 3784 µs |
| | | 50% | 516 µs | 500 µs | 10 | 3080 µs |
| | | 25% | 1032 µs | 500 µs | 10 | 4096 µs |
| | 2500 bytes | 75% | 172 µs | 500 µs | 10 | 1892 µs |
| | | 50% | 258 µs | 500 µs | 10 | 2838 µs |
| | | 25% | 516 µs | 500 µs | 10 | 3080 µs |
| | 512 bytes | 75% | 39 µs | 500 µs | 10 | 429 µs |
| | | 50% | 52 µs | 500 µs | 10 | 572 µs |
| | | 25% | 106 µs | 500 µs | 10 | 1166 µs |
| 311 Mbps | 5000 bytes | 75% | 172 µs | 500 µs | 10 | 1892 µs |
| | | 50% | 258 µs | 500 µs | 10 | 2838 µs |
| | | 25% | 516 µs | 500 µs | 10 | 3080 µs |
| | 2500 bytes | 75% | 86 µs | 500 µs | 10 | 964 µs |
| | | 50% | 129 µs | 500 µs | 10 | 1519 µs |
| | | 25% | 258 µs | 500 µs | 10 | 2838 µs |
| | 512 bytes | 75% | 20 µs | 500 µs | 10 | 220 µs |
| | | 50% | 26 µs | 500 µs | 10 | 286 µs |
| | | 25% | 52 µs | 500 µs | 10 | 572 µs |

Table with Failure Detection Latency Examples

FIG. 7

Link Aggregation Key Redistribution State Diagram

RWPR™ Link Failure and Restoration State Diagram

SYSTEM AND METHOD FOR RESILIENT WIRELESS PACKET COMMUNICATIONS

CROSS-REFERENCE TO RELATED APPLICATIONS

The present application is a continuation of U.S. patent application Ser. No. 17/516,213 filed Nov. 1, 2021 and entitled "System and Method for Resilient Wireless Packet Communications," which is a continuation of U.S. patent application Ser. No. 16/702,386 filed Dec. 3, 2019 and entitled "System and Method for Resilient Wireless Packet Communications," now U.S. Pat. No. 11,165,630, which is a continuation of U.S. patent application Ser. No. 16/150,192 filed Oct. 2, 2018 and entitled "System and Method for Resilient Wireless Packet Communications," now U.S. Pat. No. 10,498,584, which is a continuation of U.S. patent application Ser. No. 15/653,485, filed Jul. 18, 2017 and entitled "System and Method for Resilient Wireless Packet Communications," now U.S. Pat. No. 10,091,051, which is a continuation of U.S. patent application Ser. No. 14/611,534, filed Feb. 2, 2015 and entitled "System and Method for Resilient Wireless Packet Communications," now U.S. Pat. No. 9,712,378, which is a continuation of U.S. patent application Ser. No. 14/183,376, filed Feb. 18, 2014 and entitled "System and Method for Resilient Wireless Packet Communications," now U.S. Pat. No. 8,988,981, which is a continuation of U.S. patent application Ser. No. 11/351,983, filed Feb. 10, 2006 and entitled "System and Method for Resilient Wireless Packet Communications," now U.S. Pat. No. 8,693,308, which are hereby incorporated by reference herein.

FIELD OF ART

The present invention relates to wireless data communications and more particularly to resilient wireless packet communications in various network topologies.

BACKGROUND

A network topology is the pattern of links between nodes where a given node has one or more links to other nodes in the network. Physical topologies of networks include spanning tree, ring, mesh and bus, and among them a ring network is one in which the nodes are connected in a closed loop configuration and in which data is passing in sequence from node to node between adjacent nodes. A logical topology is the nature of the paths that signals follow from node to node, and in many instances the logical and physical topologies are similar. In the logical ring topology, the data flows in a closed loop clockwise or counterclockwise.

Fiber optic rings are often deployed as part of both metropolitan area networks (MANs) and wide area networks (WANs). a resilient packet ring (RPR) is a wired network topology deployed for fiber optic rings and designed for using RPR access protocol and physical layer interfaces to produce high-speed data transmission. A network with RPR topology has dual counter rotating rings (clockwise, counterclockwise) where multiple nodes can transmit on both rings simultaneously.

For increased bandwidth, load balancing and availability of communication channels between nodes (e.g., switches and stations), link aggregation or trunking, according to IEEE standard 802.3ad, is a method of grouping physical network links into a single logical link. With link aggregation, it is possible to increase capacity of communication channels between nodes using their Fast Ethernet and Gigabit Ethernet technology. Two or more Gigabit Ethernet connections can be grouped to increase bandwidth, and to create resilient and redundant links. Standard local area network (LAN) technology provides data rates of 10 Mbps, 100 Mbps and 1000 Mbps and, for obtaining higher capacity (e.g., 10000 Mbps) link aggregation allows grouping of 10 links; and where factors of ten (10) are excessive, link aggregation can provide intermediate rates by grouping links with different rates.

Wired network protocols are designed to meet RPR standards (IEEE 802.17) and aim to improve scalability and bandwidth allocation and throughput of fiber optic rings in order to meet the demands of packet-switched networks. A typical RPR supports SONET/SDH (155 Mbps to 10 Gbps) standards as well as Ethernet PHY (Ethernet physical layer interface which meets 1 Gbps to 10 Gbps rates). An RPR network carries control messages on opposite rings from data, and in the event of fiber or node failure it is required by the RPR standards (IEEE 802.17) to satisfy 50 milliseconds recovery time.

Rapid spanning tree protocol (RSTP, standard IEEE 802.1D-2004), for instance, relies on active spanning tree topology and is one in which a network can rapidly reconfigure its topology in case of a failure. With the RSTP the spanning tree re-assigns ports and learns their new MAC addresses.

SUMMARY

In view of the above, the present invention is based in part on the observation that the foregoing configurations and protocols are not optimized for wireless communications in that they require excessive overhead and provide a slow failure detection and recovery response. With the proposed approach for improving wireless communication networks, the present invention contemplates providing resiliency to failures through robust and fast failure detection and recovery which is, for instance, below-50 ms wireless link failure detection and below-50 ms wireless ring healing (recovery). Resilient wireless packet networks with link aggregation or ring topology, for instance, that are implemented in accordance with principles of the present invention also provide wireless operations with error resiliency, with minimal impact on throughput, and optimized layer-2 network reconfiguration.

Such resilient wireless packet networks are implemented using an improved Gigabit Ethernet card with functionality designed for providing these benefits. And, although this solution is capable of being implemented using external equipment such as routing devices, the improved Gigabit Ethernet card implementation is preferred because the detection and recovery signals are available locally and no additional overhead is needed. In other words, the improved Gigabit Ethernet card implementation is preferred because it provides better results with less impact on the throughput.

Hence, for the purpose of the invention as shown and broadly described herein, a method for resilient packet communications in a wireless network includes instantiating a hardware-assisted rapid transport channel failure detection algorithm in a Gigabit Ethernet data access card, and combining such rapid transport channel failure detection algorithm with a layer-2 network optimization protocol appropriate for reconfiguring whatever topology the wireless network has. The combination is responsive to failures in the network and provides for automatic failure recovery of the network in order to render communication of packets through the network resilient to such failures. The combination also provide error resiliency in the wireless operations, with minimal impact on throughput. Resiliency is provided through robust and fast failure detection, correction and recovery measures with minimal or substantially no impact on data traffic flow through the network.

In further accordance with the purpose of the present invention, a system for resilient wireless packet communications in a wireless network includes a plurality of nodes connected via wireless links and a plurality of customer data access ports. At least one of the customer data access ports is connected to one of the nodes at one end of the network with a second access port being connected to another one of the nodes at the other end of the network. Each node has a Gigabit Ethernet data access card operative to execute a hardware-assisted rapid transport channel failure detection algorithm and to combine the rapid transport channel failure detection algorithm with a layer-2 network optimization protocol appropriate for reconfiguring whatever topology the wireless network has. Again, the combination is responsive to failures in the network and provides for automatic failure recovery of the network in order to render communications of packets through the network resilient to such failures; and, in addition, the rapid transport channel failure detection algorithm is operative to provide wireless network end-to-end failure detection and recovery and provide wireless operations with error resiliency, with minimal impact on throughput.

These and other features, aspects and advantages of the present invention will become better understood from the description herein, appended claims, and accompanying drawings as hereafter described.

BRIEF DESCRIPTION OF THE DRAWINGS

The accompanying drawings, which are incorporated in and constitute a part of this specification, illustrate various aspects of the invention and together with the description, serve to explain its principles. Wherever convenient, the same reference numbers will be used throughout the drawings to refer to the same or like elements.

FIG. 4A shows one embodiment of the modified interface engine.

FIG. 7 is a table of failure detection latency examples.

DETAILED DESCRIPTION

Figure 1A:
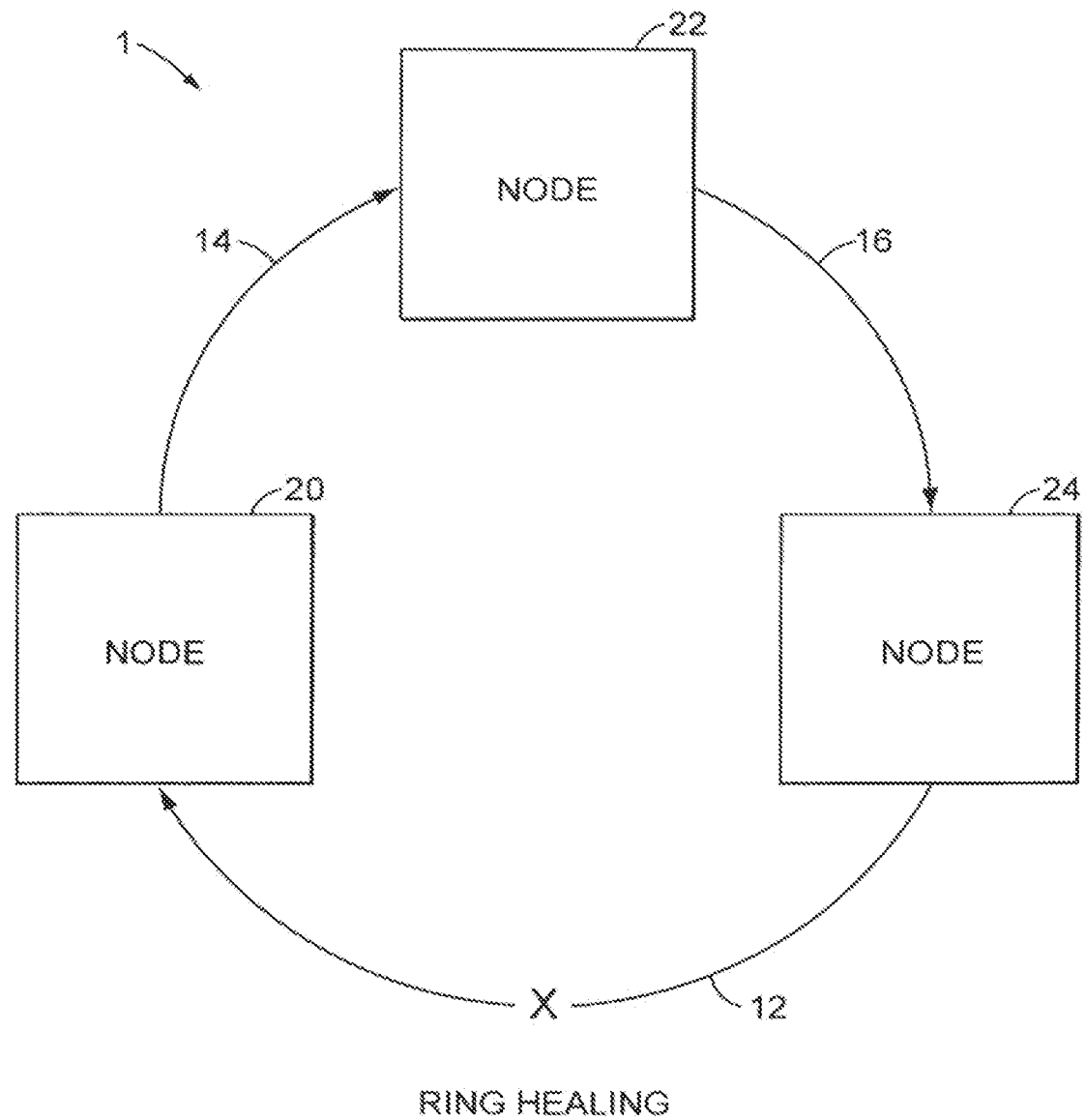
FIGS. 1A-1D show a prior art wireless network with a Gigabit Ethernet data access card, an FPGA-based interface processing engine and the dual-channel packet processing components thereof, respectively.
Figure 1B:
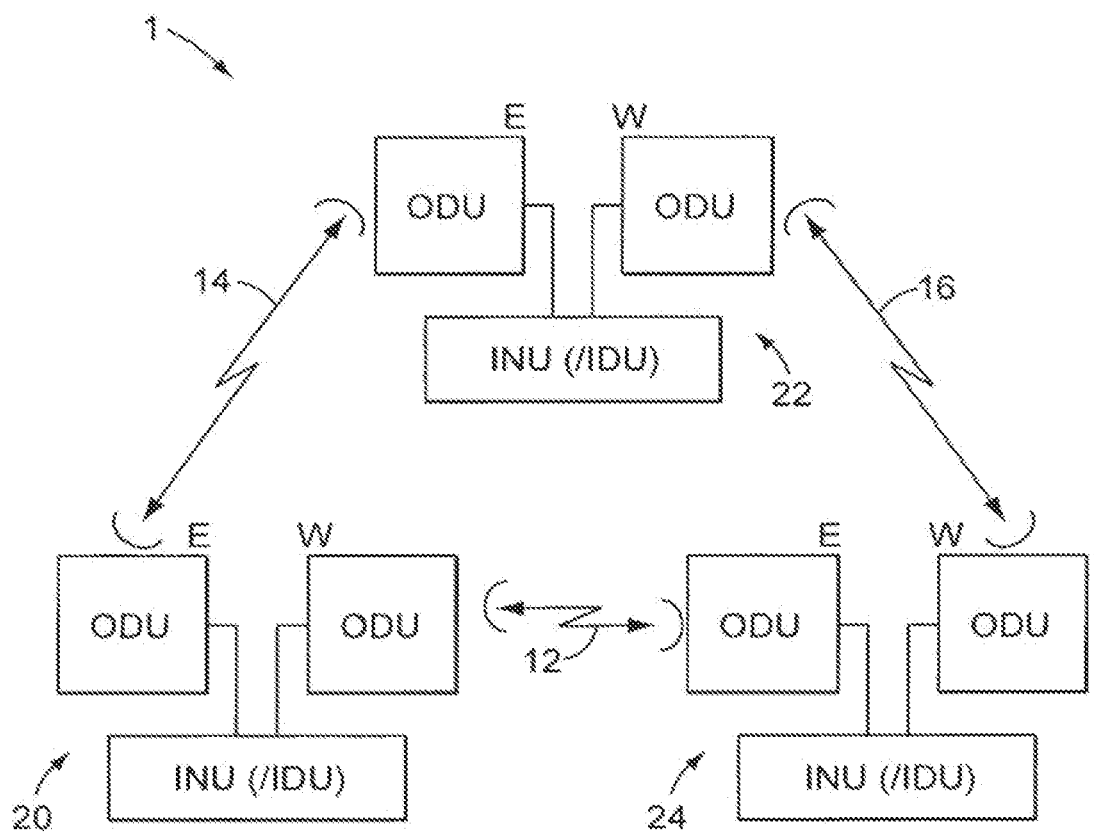

As noted, one issue in wireless communications is rapid failure detection and recovery. FIG. 1A illustrates a ring-healing (recovery) example wherein a ring with a least three nodes a link 14 takes over for a failed link 12 (shifting direction of data flow away from the failed path). In a wireless communication network with three or more nodes arranged in a ring topology the link between the nodes is wireless. The links are provided in systems such as the Eclipse™ via an outdoor unit (ODU). FIG. 1B illustrates an existing wireless ring network in which recovery from failure of a node, say 20, or failure of a link, say 12, is done by switching over to a healthy link until the failed link is repaired.

Figure 1C:
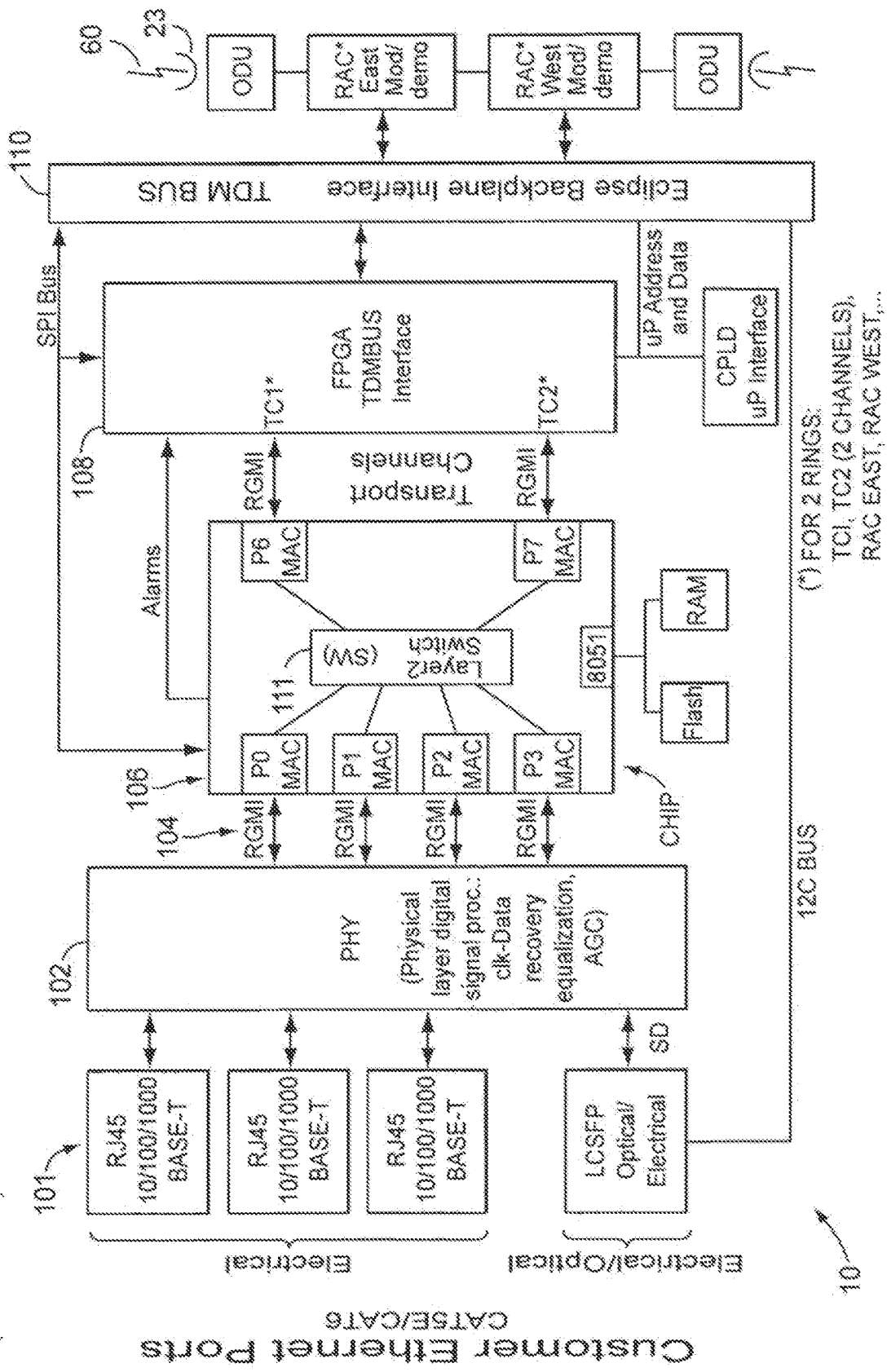

As a further point of comparison, FIG. 1C is block diagram illustrating the design of existing data access cards (DACs). The building blocks in the DAC provide layer-2 switching capabilities, payload transport and configuration, monitoring and control functions. The payload received in the customer Gigabit Ethernet ports 101 is processed by a physical layer digital processing component 102 and then by a switch (layer-2 switch) 111. The switch analyzes the source and destination media access control (MAC) addresses and determines the output port over which the payload will be delivered (e.g., P0 . . . 3). Incidentally, for each physical device type, the MAC sub-layer of the data link layer (level 2) in the open systems interconnection (OSI) model uses MAC addresses and the other sub-layer in the data link layer is the logical link control (LLC) sub-layer. In a local area network (LAN) or other network, the MAC address is a node's unique hardware identifier which a correspondence table relates to the node's IP address; and on an Ethernet LAN, it's the same as the node's Ethernet address. For payload delivery, in addition to the above information, internal and external virtual LAN (VLAN) information, traffic priority, configured throughput, and buffer capacity also play a role. Using such information, the switch 111 applies policing, scheduling and shaping algorithms to determine path and priority that each packet should take and if it should be consumed, forwarded or dropped.

When packets are delivered to transport channels TC1/TC2 through ports P6/P7, a processing engine 108, e.g., a field programmable gate array (FPGA), application specific integrated circuit (ASIC) or complex programmable logic device (CPLD)-based processing engine, transforms the packets into suitable blocks (with associated time slots) to be carried by the backplane interface 110 and by the radio link(s) 60 attached to it. Note that although the number of transport channels and the carrier time slots (with independent timing) is configurable in the DACs, existing implementations use overhead information to resolve possible clock variations among the carriers.

Figure 1D:
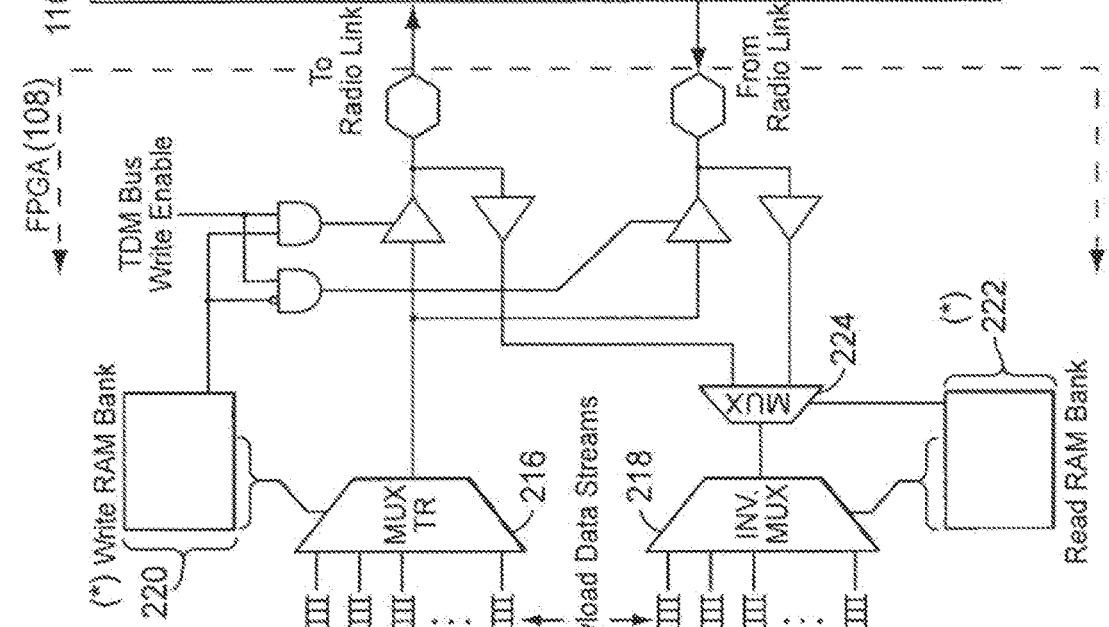

FIG. 1D illustrates the overhead use in an FPGA-based processing engine within existing DACs (e.g., Gigabit Ethernet card in existing Eclipse™ platforms from Stratex Networks, Inc.). As shown, in the wireless transmit (TX) direction, when an Ethernet packet arrives to TC1 or TC2, a high-level data link control (HDLC)-like encapsulation is applied by the overhead insertion module 202 in the FPGA-based processing engine 108. The added overhead allows for the later synchronization of the multiple segments with time slots into which the packet will be divided. A segmentation process is carried out by an inverse multiplexer 210 that divides the packet into the configured number of segments with time slots (links) that will be used for the transport (bandwidth allocation). These segments are transferred across the backplane interface to a radio access card (RAC) 35, 37 that will transmit them through a wireless link. A byte-synchronous idle fill is inserted 206 in the transport channel stream when no payload is present.

In the wireless receive (RX) direction the RAC will receive from the antenna frames that contain the multiple segments (links with time slots) that are being used to transport the Ethernet payload. These segments are transferred via the backplane interface 110 to the DAC. The multiplexer (Mux) 212 in the DAC, reassembles the original Ethernet packet from the multiple segments based on the time-to-data indexing information from the memory 222. To guarantee the integrity of the packet, a byte synchronization stage is required. The overhead information is used to offset any clock differences that each of the independent segments used for transporting might have, effectively aligning them back to the original packet layout. Any idle fill present in the transport channels is removed 208 so it never reaches the layer-2 switch 111 (item 111, FIG. 1C). The overhead (encapsulation) is then removed 204 and, using the TC1 and TC2 interfaces, the packet is transferred to the layer-2 switch 111.

Figure 2A:
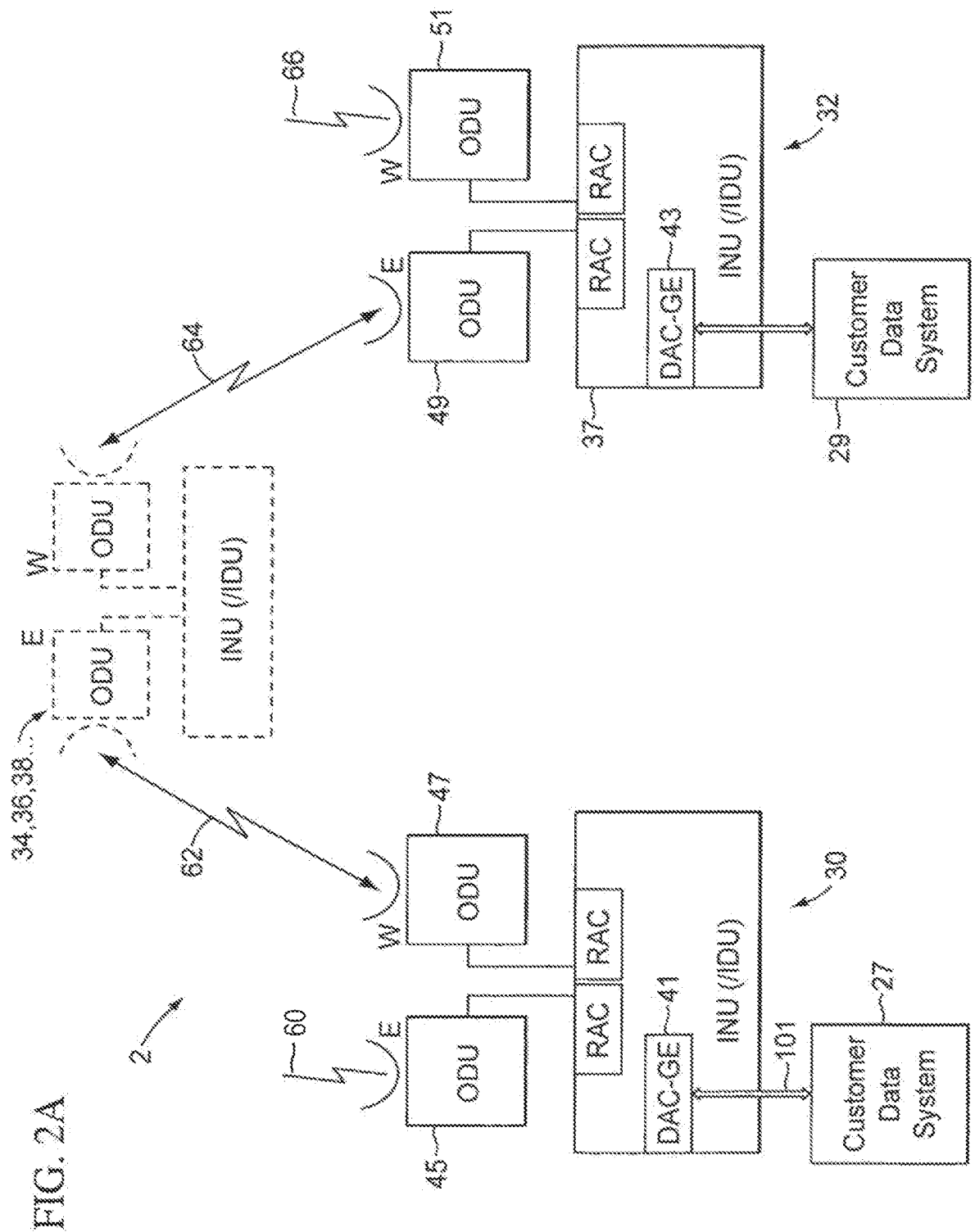
FIGS. 2A-2B show linked nodes in a wireless network where the nodes have a modified Gigabit Ethernet data access card (DAC-GE).

Based on the foregoing, in order to achieve more rapid failure detection and recovery, the above-described DAC which is currently used in the nodes of FIG. 1B is replaced with a modified interface card as illustrated in FIG. 2A. The modified data interface card can be deployed in new as well as existing wireless communication platforms such as the Eclipse™. Various embodiments of the modified data interface card are possible without departing from the scope and spirit of the present invention, and we proceed with the description of the architecture and functionality of one such embodiment. In this example we focus however on the modified Gigabit Ethernet card which we refer to as the "DAC-GE."

In the example of FIG. 2A, the DAC-GE 41, 43 is deployed in the INU (intelligent node units) of at least two of nodes 30, 32, 34, 36, 38. The DAC-GE includes functionality that enhances failure detection and recovery without compromising throughput, providing, for instance, below-50 ms failure response time. The DAC-GE interfaces with a customer data system 27, 29 on one side and with the radio access cards (RACs) 33, 35, 37, 39 on the other. The data from each RAC flows to a respective one of the outdoor units (ODU 45, 47, 49, 51; in a split mount system such as the Eclipse™) and through the wireless link 60, 62 64, 66.

Note that the diagram in FIG. 2A does not show a complete ring, which would require, in addition to at least three nodes, that the network provide a closed loop by, for instance, uniting wireless links 60 and 66 making them one and the same. Note also that the third node 34 is shown in dotted lines to illustrates the fact that this may in fact represent one or more nodes 34, 36, 38 etc.; and if there are multiple nodes between nodes 30 and 32, each pair of such nodes would be linked wirelessly. In other words, there could be multiple hops between nodes 30 and 32. Nevertheless, the failure detection and recovery operations of the DAC-GE are indifferent to the number of hops and they beneficially facilitate network end-to-end failure detection and recovery.

Moreover, unlike existing systems in which failure detection and recovery routing and switching occur at the data link layer (layer 2) or higher level of the OSI model, in a system configured in accordance with the present invention failure detection operations are performed at the physical layer (level 1) and recovery operations are performed at the data link layer (layer 2). While the data link layer is responsible for the integrity of each segment in the ring, the physical layer is better for implementing a faster mechanism for monitoring the integrity of the physical channels and detect any failure from end to end of the network. For instance, the physical layer can quickly detect absence of incoming data streams once a predetermined time threshold is reached and redefine the topology of the system (learning MAC addresses of alternate ports). This is not the same but is somewhat akin to the rapid spanning tree protocol.

Figure 2B:
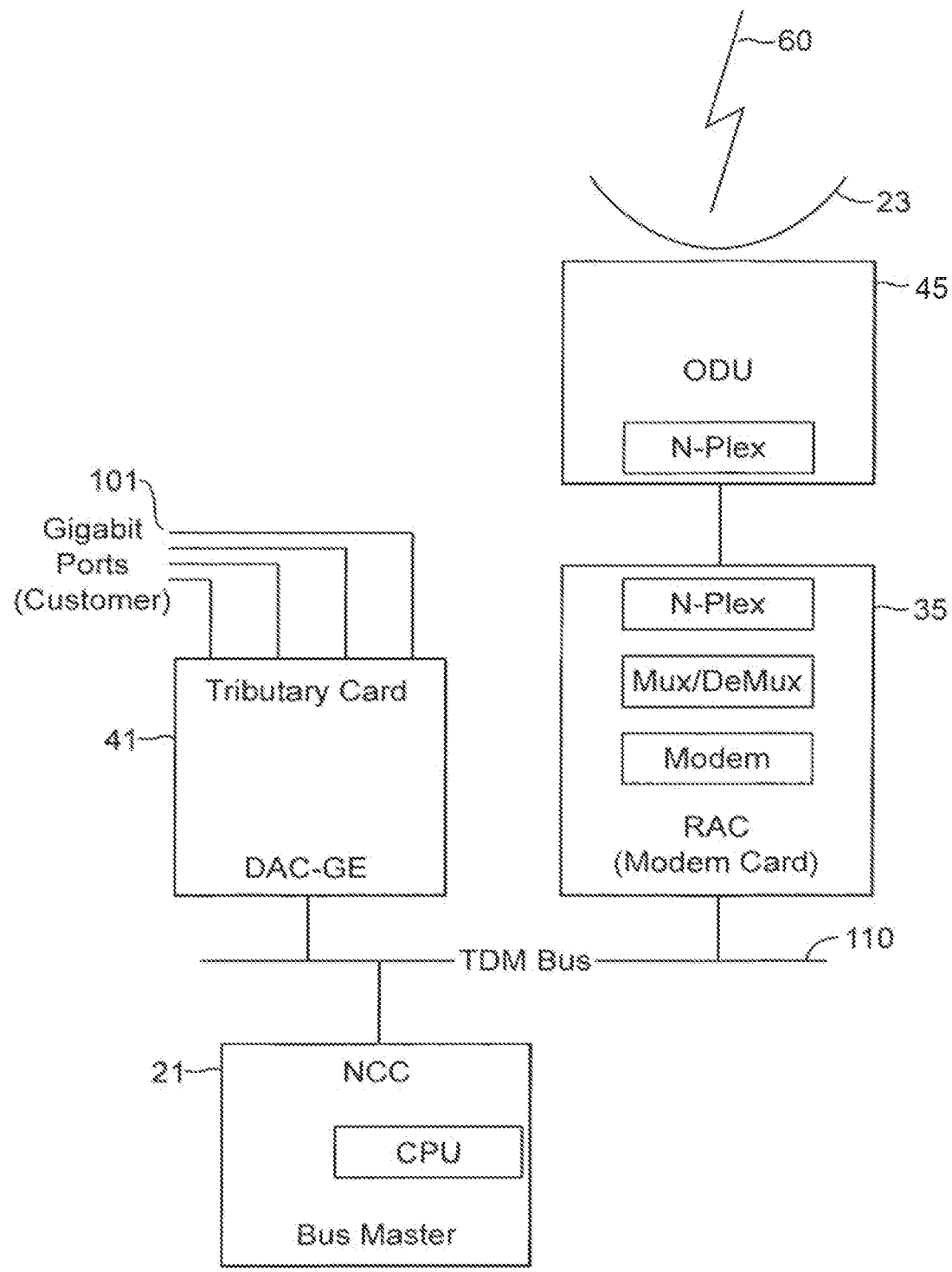

The block diagram in FIG. 2B illustrates the interface between the DAC-GE and other components associated with a node (e.g., 30). In the INU, the TDM bus 110 provides the backbone through which various cards such as the node control card (NCC) 21, DAC-GE 41 and RAC 35 are connected. The NCC includes a processor and functions as a bus master controlling access by the various cards. Through the customer interface ports (Gigabit Ethernet ports) 101, the DAC-GE communicates with customer data systems, and the RAC 35 interfaces between the DAC-Ge 41 and the wireless front-end, the ODU 45 and antenna 23.

Each DAC-GE is designed to perform the rapid transport channel failure detection algorithm that the Rapid Wireless Packet Ring (RWPR™) employs. Rapid transport channel failure detection is designed for fast and reliable failure detection in one or both of the transport channels present in the Gigabit Ethernet card. Advantageously, the hardware-assisted protocol implements the rapid transport channel failure detection algorithm, and, as will be later described in more detail, this algorithm is used in two applications: link aggregation and resilient wireless packet ring operations.

The design of the rapid transport channel failure detection algorithm includes a number of possible considerations, some more important than others. One such design consideration is backwards compatibility with existing Gigabit Ethernet card frameworks. It is also desirable to design the algorithm to be resilient to noise and small error bursts. For instance, if an uncorrectable frame is sent out by the radio link the transport channel status should not be changed, i.e., single packet errors should not trigger a status change.

Also, it is important to make the rapid transport channel failure detection algorithm an end-to-end solution. That is, the algorithm should be agnostic to the number of hops required by the transport channel to get the payload across the radio link (presence of repeaters). Moreover, the rapid transport channel failure detection algorithm should be able to resolve failures in either direction independently (i.e., unidirectional failures).

Radio link fades and outages occur due to natural conditions and they are typically bidirectional, but hardware failures may not be. The failure of a power amplifier, or transmit (TX) or receive (RX) synthesizer, for example, would cause a unidirectional failure. The algorithm should be capable of detecting and indicating independently when the failure occurred and if it took place in the transmit or receive direction. Some applications may benefit from the possibility of having unidirectional traffic still going through. Link aggregation for example may benefit from having two channels transmitting in one direction and only one coming back.

Moreover, the rapid transport channel failure detection algorithm is preferably autonomous in the detection of a failure in that it does not depend on other alarms or signals available in the system to determine the failure. Such algorithm is also independent from the presence of payload traffic.

In addition to being autonomous, the rapid transport channel failure detection algorithm is preferably designed to automatically recover from a failure. For instance, if the protocol used to implement the failure detection remains in operation (attempting to re-establish communication with the far-end) after a failure takes place, it will be able to recover automatically when the link is restored.

Apart from the foregoing, one typical design requirement is fast, preferably below-50 ms failure detection capability. To this end, the configuration and management processor is preferably not involved in the rapid transport channel failure detection algorithm and it does not use the out of band network management system (NMS) overhead channel present in the radio link to convey decision information or status. Additionally, the algorithm is designed to perform its functions with the least amount of bandwidth (overhead) possible. Again, this protocol is preferably embodied as a hardware-assisted protocol implementation.

Figure 3:
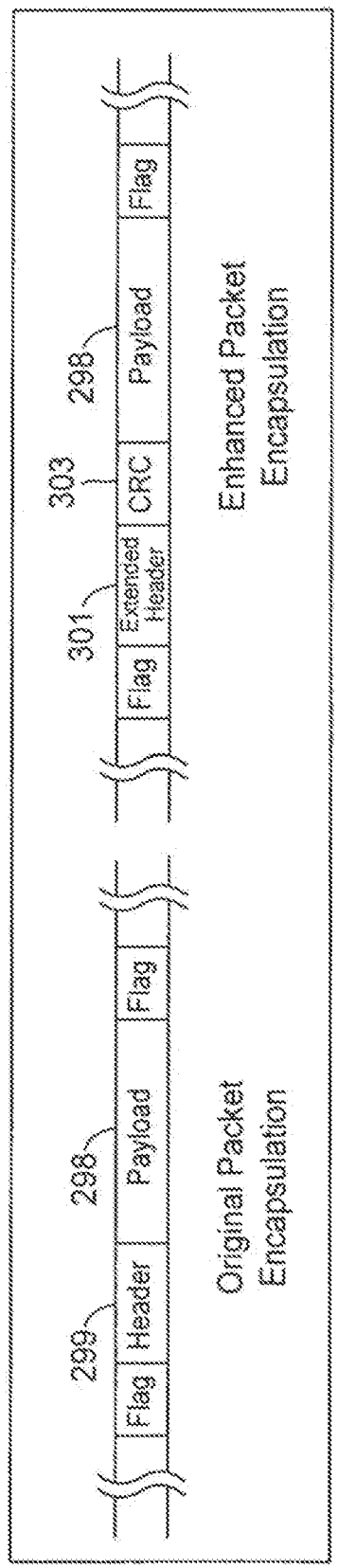
FIG. 3 illustrates an enhanced packet encapsulation.

Ethernet frame encapsulation is therefore designed to accommodate these requirements. In the existing systems, the DAC provides encapsulation of Ethernet frames received on TC1 or TC2 into an "HDLC like" packet structure that is used for synchronization purposes. However, in accordance with the design criteria and principles of the present invention, a different packet structure is proposed with the addition of a header field extension such that redundancy and status information can be transferred without too much additional overhead. The extra header field conveys RX status, and a cyclic redundancy check (CRC) (checksum) guarantees the integrity of the header information. FIG. 3 shows the proposed header field extension 301 and the CRC field 303 alongside the payload field 298. The extended header field 301 includes receive and transmit (TX, RX) status information.

FIG. 4A illustrates a modified FPGA-based processing engine that is designed to implement the rapid transport channel failure detection algorithm. Note that other configurations of the processing engine are possible although the preferred design employs a hardware-assisted implementation in an FPGA, CPLD, ASIC-based processing engine or other logic circuitry. (We refer to these implementations collectively as the "FPGA-based processing engine" or simply "processing engine.")

Figure 4B:
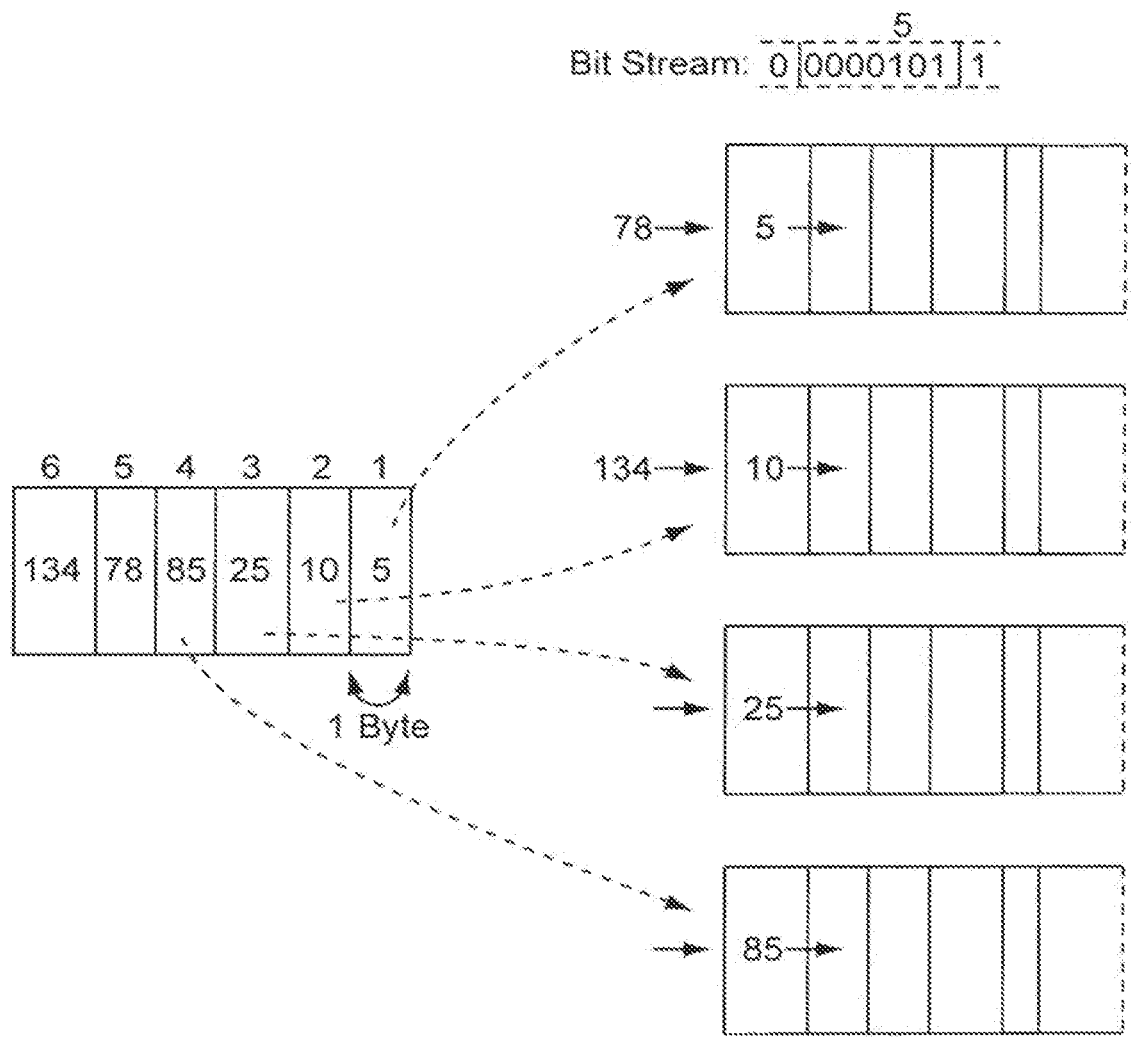
FIG. 4B illustrates packet alignment.

The extended header with the TX and RX status information is kept by the processing engine in the DAC-GE at each node (i.e., at each end of the wireless communication link). The RX status is computed based on information obtained from the traffic alignment indicator 314 as well as the received packets and their integrity. The traffic alignment is intended for maintaining the integrity of packets that have been divided into segments and need to be re-constructed properly. Traffic alignment is illustrated in FIG. 4B. Returning to FIG. 4A, the TX status is a reflection of the far end node's RX status indicator that is conveyed in the header of the received packets. In this design, a set of configurable registers allow adjustment of the system behavior to meet particular carrier class specifications.

These registers are: keep-alive insertion rate, packet receive timeout, CRC validation threshold and CRC error threshold. The keep-alive packet insertion rate register 304 represents the rate in microseconds that the packet insertion engine will wait before inserting a keep-alive packet (under idle traffic conditions). The packet receive timeout register 310 represents the number of microseconds that the receive engine will wait for a packet before declaring an idle RX timeout. The CRC validation threshold register 311 represents the number of consecutive good CRC packets that will have to be received in order to change RX status from bad to good. The CRC error threshold register 309 represents the number of consecutive bad CRC packets that will have to be received in order to change RX status from good to bad. The two configurable CRC registers provide a hysteresis to avoid bad-good status oscillations on a small number of errors.

As mentioned, one of the requirements for the algorithm is to be independent from the presence of payload traffic in the channel. To be able to meet such requirement, the algorithm is designed to detect the absence of payload traffic (idle) and insert keep-alive packets that will maintain the link status. The format of a keep-alive packet is basically the same as a normal payload packet format but without the payload segment and it conveys the same status and integrity information.

Figure 5:
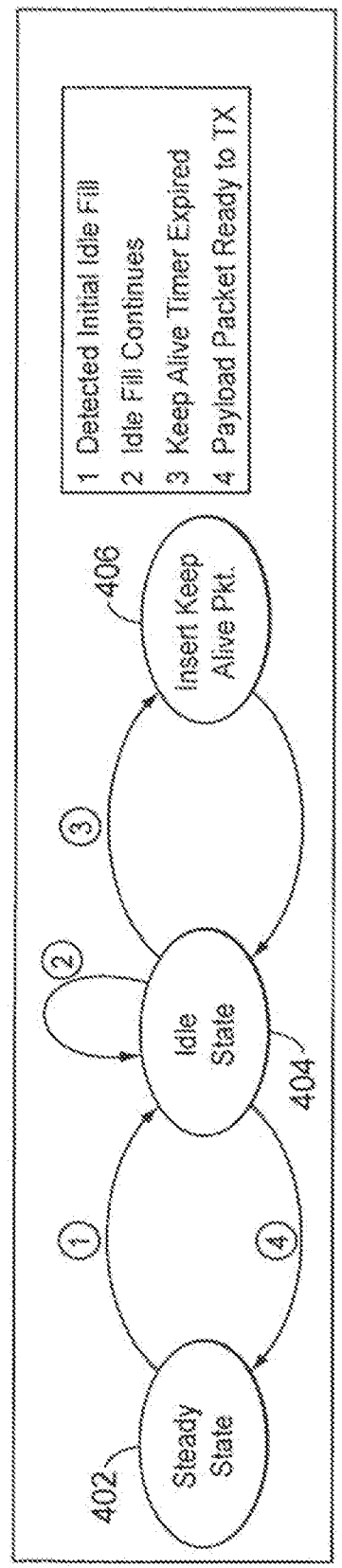
FIG. 5 is a state diagram showing keep-alive message insertion.

FIG. 5 is a state diagram that shows the insert keep-alive packets operation. As shown, after a channel idle condition is detected the algorithm transitions from steady state 402 to an idle state 404. The packet fill continues while in the idle state 404 and before the keep-alive timer expires 406. When the payload is ready to transmit again, the algorithm transitions to the steady state 402.

Since keep-alive packets are only inserted when the channel is idle the amount of overhead due to such packets is minimal. The delay introduced by these packets is sufficiently small and almost undetectable because the size of these packets is so small. In the worst case scenario a new packet ready and waiting to be transmitted will be delayed by the insertion of only one keep-alive packet, assuming that the arrival of the new packet matches the expiration of the keep-alive insertion timer under idle traffic conditions.

Figure 6:
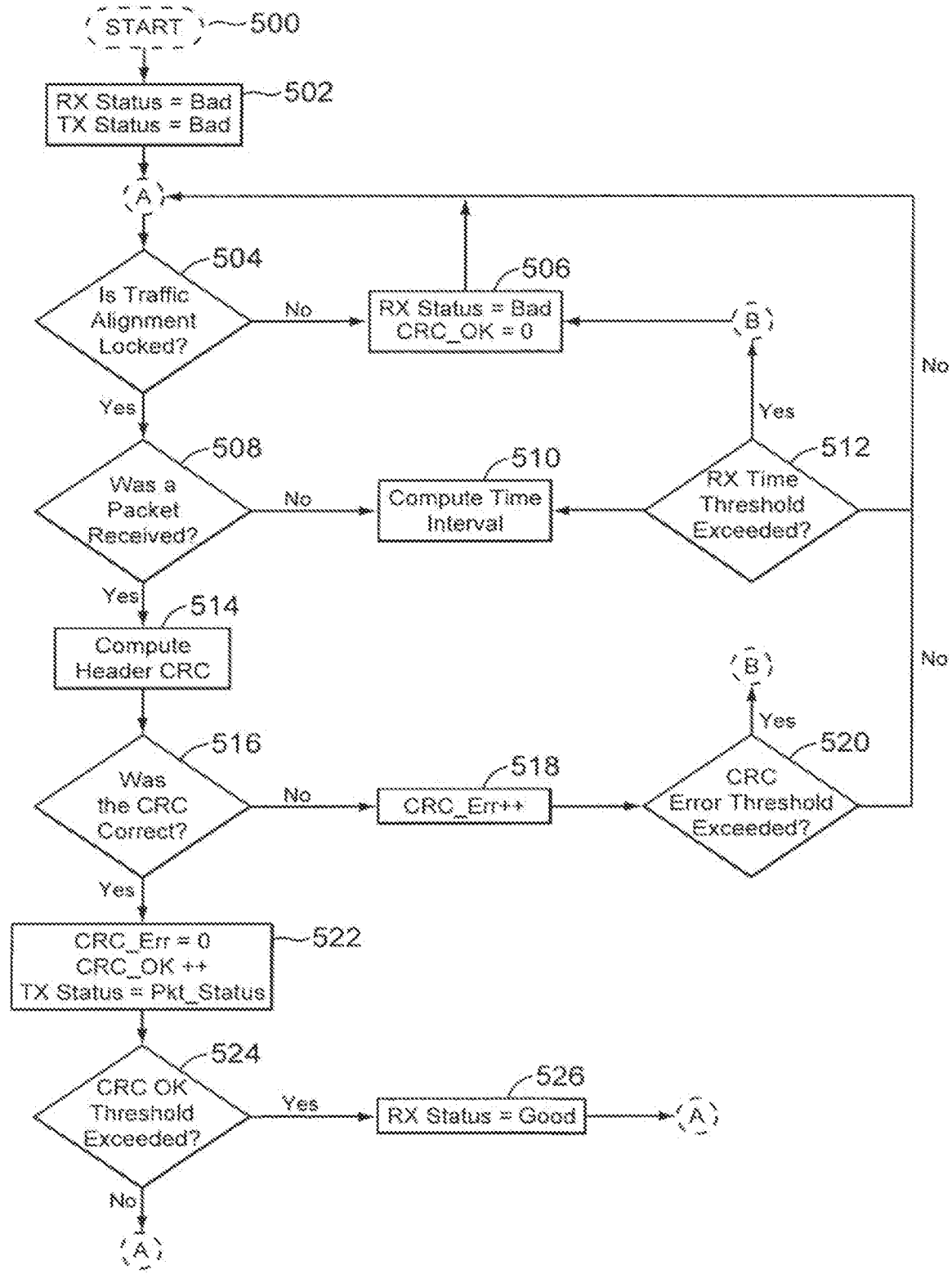
FIG. 6 is a flow diagram of failure detection and recovery in accordance with principles of the present invention.

FIG. 6 is a flow diagram illustrating the failure detecting and recovery algorithm. This diagram shows the rapid transport channel failure detection algorithm including the TX and RX status updates and recovery conditions.

As mentioned, the rapid transport channel failure detection algorithm is capable of discovering a link breakdown unidirectionally in that it is capable of detecting a TX failure independently from an RX failure. In the receive direction there are several clues that will lead the algorithm to determine whether there is a failure. In this example, three main indications are used: traffic alignment error, packet received timeout and CRC error threshold exceeded. The traffic alignment error is an alarm that indicates that the local receiver has not yet synchronized with the far end transmitter 504. The packet received timeout condition 512 indicates that there has been an unexpectedly long period of time during which no packets have been received 508. The CRC error threshold exceeded condition 520 indicates that the last n consecutive packets received had a CRC error 516 and that, therefore, the channel is not reliable. In this case n is a configurable parameter that will change according to the transport channel capacity.

Any of the three conditions described above will indicate a bad receive (RX) status and all of them will have to be absent in order to declare a good RX status. The RX status (good or bad) will be added to all packet headers associated with its transport channel, notifying the far end node in this way of the current receive conditions. The TX status therefore is a reflection of the far end node TX status as reported over packets with good CRC. The far end RX status contained in bad CRC packets shall be ignored.

In order to meet carrier class failure detection expectations, the configurable threshold and parameters of the algorithm can be adjusted according to the different capacities allocated to the transport channel. For instance, the number of successive packets in error can be adjusted to filter out error bursts and provide a confidence level for the error detection. The keep-alive packet insertion rate can also be tuned depending on the expected traffic load to achieve better response time. For a high utilization percentage the use of keep-alive messages will have a low probability of occurrence, whereas in low utilization percentages these messages will be inserted on regular basis. To demonstrate the effects of this algorithm, the table in FIG. 7 provides a few examples of the detection latency for 155 and 311 Mbps transport channel capacities.

Of course, it is beneficial and preferred that once a failure is detected the algorithm continues to work. To that end, the insertion of keep-alive messages to recover the link status needs to be maintained even if the payload traffic has stopped to flow in the affected transport channel. These keep-alive messages will carry all the information required to recover to a good 1 ink status once the impairment that caused the failure is removed.

However, before declaring a link's status as good, the number of consecutive packets with good CRC needs to exceed the CRC validation threshold. This action prevents oscillation and provides a good confidence level for the transition to take place. Having the CRC validation threshold as a configurable parameter, allows the user of the system to choose the confidence level he wants for a good link status.

The above-described algorithm and DAC-GE have applications in link aggregation and resilient packet rings. Each of these applications will be explored below.

Figure 8:
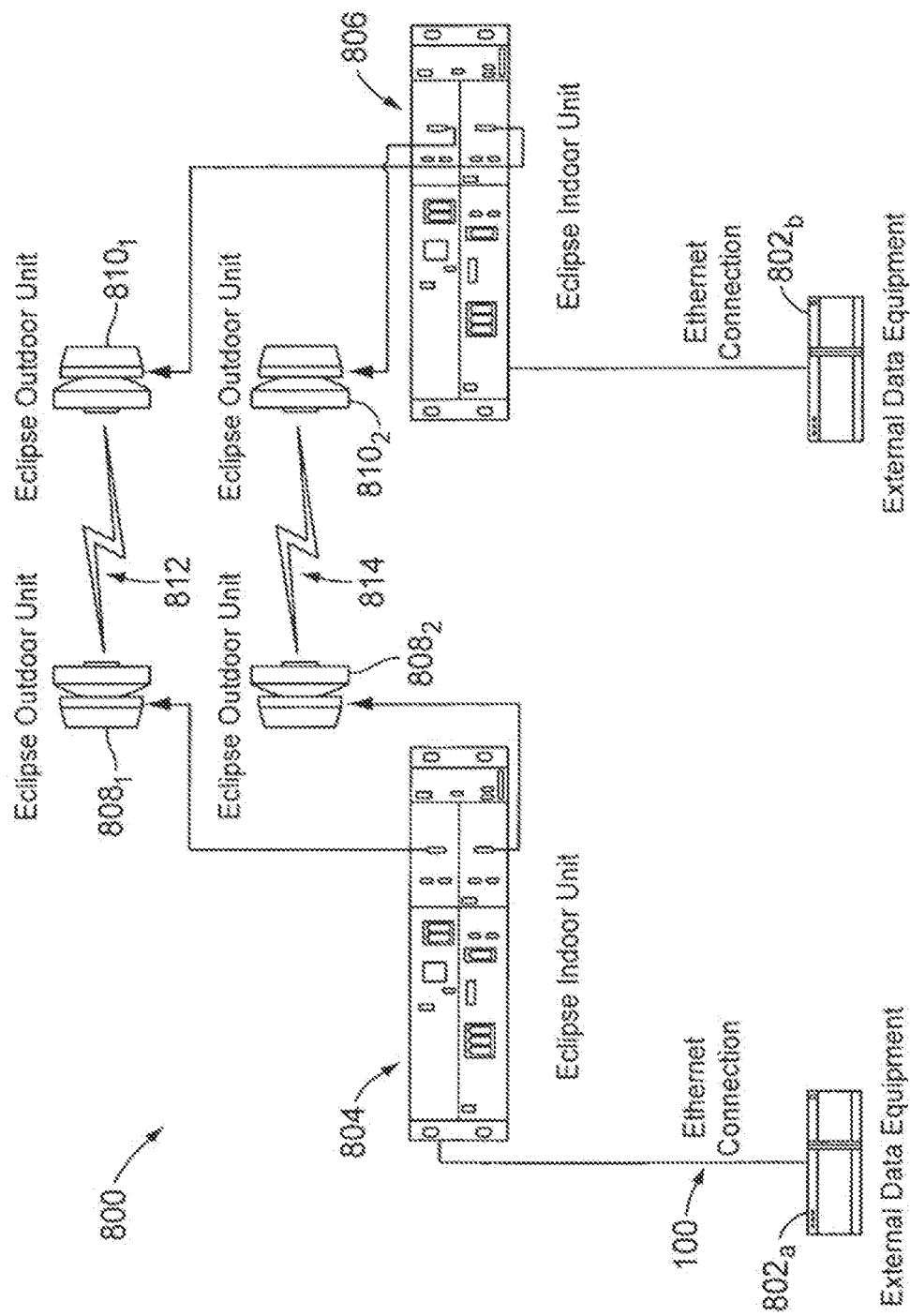
FIG. 8 is a wireless network with link aggregation configuration.

We start with the link aggregation. As an example, FIG. 8 shows the architecture of a 1+1 Eclipse™ Microwave radio link (configurable for link aggregation). A typical protected (1+1) microwave radio system operates in normal and standby operation modes. The wireless data traffic uses the top radio path 812 in normal mode with the other path 814 being on standby; and in the case of an equipment failure or fading condition, the wireless data traffic uses the redundant radio path 814.

When a link aggregation group (LAG) is created, a set of otherwise independent physical links (members) 812, 814 is combined together to operate as a single virtual link (a single logical link). A link aggregation group key (LAGK) is correspondingly designated for and distributed to each LAG member (LAGM). These keys are normally used by the Ethernet switch (layer-2 switch akin to that shown in FIG. 1C, item 111) for forwarding the Ethernet traffic to the associated physical links based on the traffic source and destination MAC addresses.

Note that this approach of using multiple physical links to transport Ethernet traffic between two Ethernet switches is commonly used for achieving increased link availability and bandwidth while avoiding loop formation. However, the detection and the switching in an existing system would typically be made within 100 ms; and failure recovery could take seconds using a standard messaging approach. Thus, to achieve or exceed carrier class Ethernet transport channel standards the link aggregation depends on fast failure detection and recovery.

In accordance with principles of the present invention, the link aggregation in combination with the preferred hardware-assisted rapid transport channel failure detection algorithm (described above) allows failure response and recovery within hundreds of microseconds rather that what would normally take up to seconds using the standard messaging approach. In particular, with the DAC-GE installed in the INUs 804, 806, a RWPR radio system has the ability to operate at twice the speed using the two radio links 812, 814 and sending packets on each channel. The algorithm is resilient to error propagation and eliminates unnecessary switchover. Because of the fast detection of a link failure or fading conditions the system will rapidly switch to a single link (812 or 814). The redundancy characteristics of a LAG in combination with the rapid transport channel failure detection algorithm operate to redirect the traffic among the remaining reliable physical links. The switching and queuing of the packets is reorganized by a link aggregation control task residing in the Ethernet switch present in the DAC-GE (not shown).

Additionally, taking advantage of the unidirectional failure detection capabilities of the algorithm, a link aggregation system could have an asymmetric behavior by having the full link throughput available in one direction while using only a limited throughput (due to unidirectional link failure) in the other. This is the case of video-broadcasting systems or other applications that heavily use broadcast or multicast transmission or that are asymmetric in nature.

Figure 9:
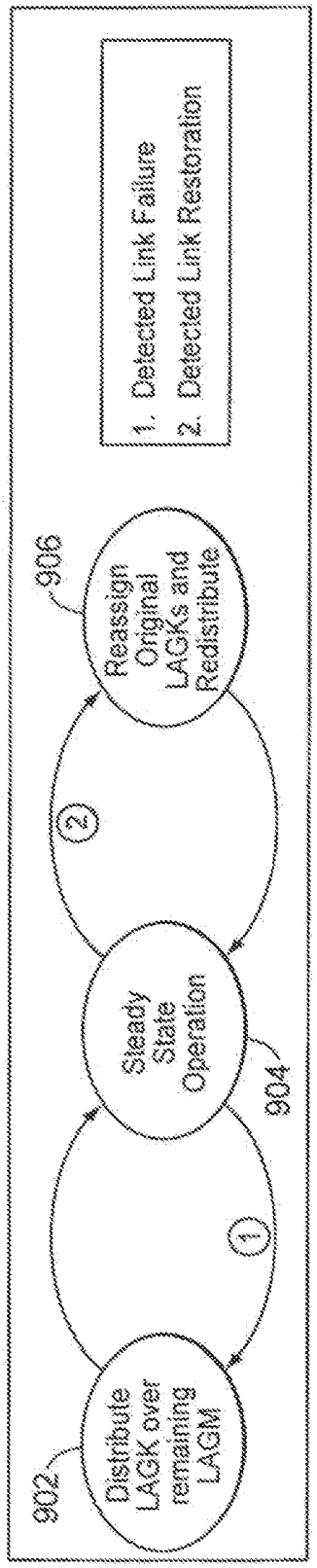
FIG. 9 is a state diagram of link aggregation key re-distribution and re-assignment.

FIG. 9 is a state diagram illustrating a dynamic link aggregation key redistribution upon failure or restoration of a link aggregation member. The behavior depicted in the state diagram improves the overall link availability by converting a 2+0 link to a 1+0 operation when a link failure occurs 902. It is important to note that with the key redistribution, the total traffic is shifted to the remaining LAGM(s). That is, from steady state 904, upon detecting the failure the state switches to distributing LAGK to remaining LAGM 902. In other words, with this approach, traffic flow of failed links is redistributed, rather than being suspended, with the remaining links (LAGMs) taking over for failed links temporarily until they are restored so that recovery is fast and the entire traffic flow can continue. This approach has significant advantages over conventional techniques that maintain only the traffic flow associated with the designated keys of the remaining LAGMs and the traffic flow associated with keys of failed LAGM is suspended (starved) until the link that failed is restored. Indeed, when a link fails the entire traffic continues to flow, although the overall link aggregation throughput is reduced if the total number of keys is redistributed over the remaining LAGM(s); and if congestion conditions are reached traffic prioritization and flow control takes over to maintain the flow.

When failure conditions disappear, the link aggregation in combination with the rapid transport channel failure detection and recovery algorithm restores the total throughput of the link and reassigns the original LAGK set to the newly restored LAGM 906. If any additional redistribution is required it takes place in this same iteration.

Figure 10:
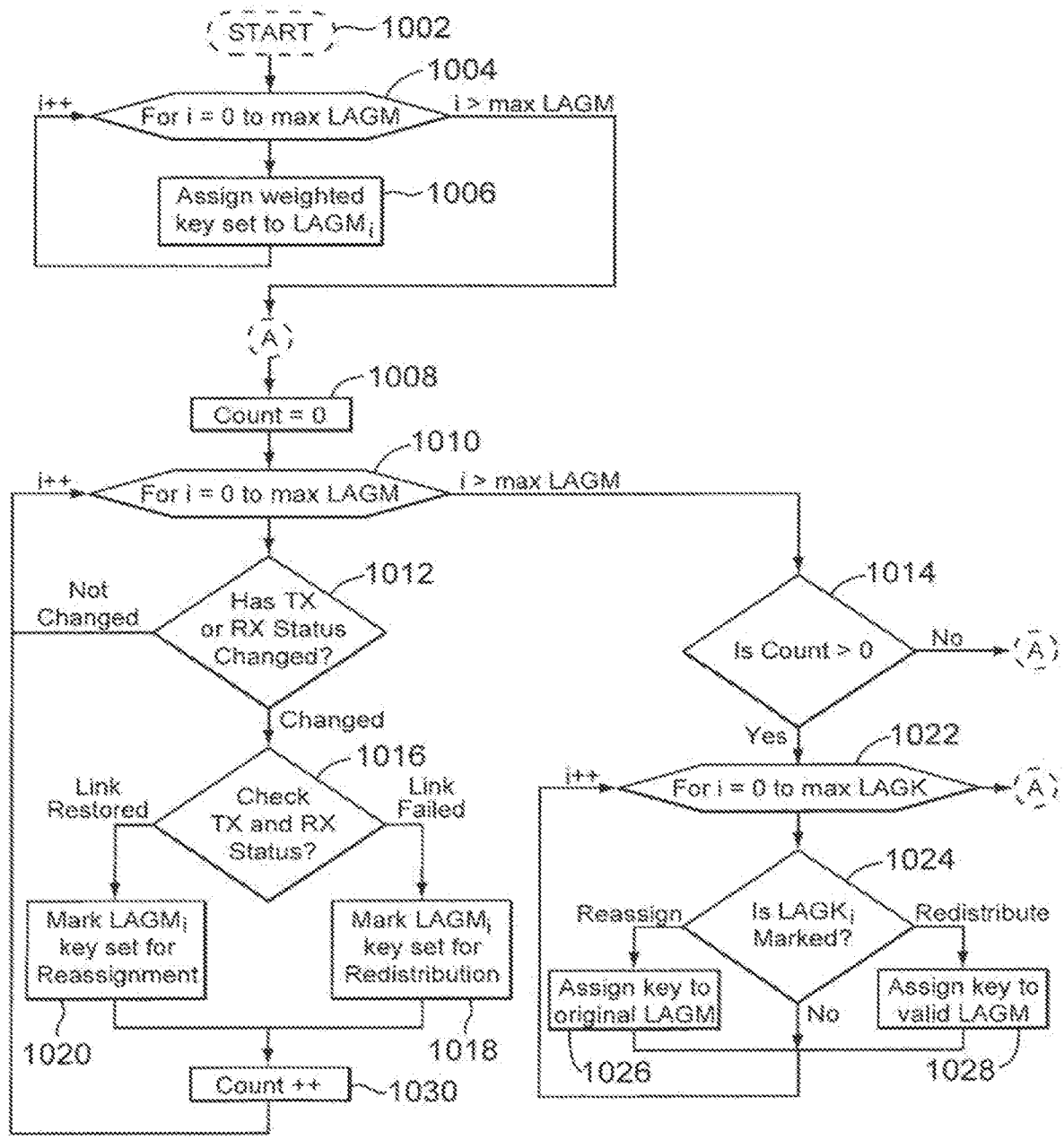
FIG. 10 is a flow diagram of the link aggregation combined with the rapid transport channel failure detection algorithm.

To implement the foregoing state diagram, the link aggregation in combination with the rapid transport channel failure detection algorithm operates as shown, for instance, in the flow diagram of FIG. 10. For each LAGM, a key is assigned to that LAGM 1006 and the RX or TX status is checked 1012. If the TX or RX status has changed 1012, the algorithm determines if the LAGM status change is a failure or restoration 1016. The detection of failure or restoration and recovery is implemented at the DAC-GE in the FPGA-based processing engine (i.e., hardware-assisted detection and recovery). Once link failure or link restoration (TX or RX status changes) is detected, the LAGM is marked for key re-distribution 1018 in the case of failure and for key re-assignment 1020 in the case of restoration. For each link not previously accounted for (not yet assigned a key), the combined link aggregation and rapid transport channel failure detection algorithm determines if the LAGM is marked 1022, 1024 and, if so, a key is re-distributed to it 1028 upon failure or assigned to the original LAGM 1026 upon restoration.

We turn now to the description of the aforementioned resilient wireless packet ring (RWPR), a second application for the rapid transport failure detection algorithm. Generally, the ring topology has been widely used in connection with synchronous optical networking (SONET) and synchronous digital hierarchy (SDH), at layer 2, where bridges and L2-switches make the packet routing decisions. Typically also, to avoid confusing Ethernet loops by breaking them in a controlled manner, systems use the spanning tree protocol (STP) and its successor rapid spanning tree protocol (RSTP). Then, in the event that a link in the ring fails, the RSTP algorithm reconfigures it using a fast messaging system.

As with conventional link aggregation, existing ring configurations employ messaging protocols to execute the RSTP. Such ring configurations used external switches to detect link failures and convey information that will be used by the RSTP to reconfigure the links.

Generally, the conventional RSTP uses a fast messaging protocol based on bridge protocol data units (BPDUs) for communications between participating bridges in the network. These BPDUs help determine the port roles (root, designated, alternate and backup) and port states (discarding, learning and forwarding) for every bridge port that participates. The BPDUs are also used for detecting link failures among the ports and to reconfigure the network accordingly. The BPDUs are sent at specified time intervals (hello-time intervals) by all bridges and in all participating ports in the network. These time intervals are measured usually in seconds (e.g., the default specified value is 2 seconds).

Accordingly, a link failure is detected on a given port if BPDUs are not received for three consecutive time intervals. A bridge determines that it has lost connectivity to its direct root or neighboring bridge if it misses three BPDUs in a row. If a port in the active network topology detects a link failure, a network reconfiguration is required. The bridging elements adjacent to the failure will send BPDUs to their neighbors to notify them about it and will change the state and role of the remaining ports according to the BPDUs they receive. Similar actions will be taken by all the participating bridges in the network. They will have to review and update their port states and roles to effectively achieve the network reconfiguration that is required. However, the conventional failure detection (measured in seconds on average and several hundreds of milliseconds in the best case scenario) is still very slow considering the carrier class transport requirements.

However, the messaging protocol is relatively slow even with RSTP and its convergence after a failure can be measured in the order of seconds. Carrier class applications require a failure convergence of 50 ms or lower, and this is impossible to achieve using RSTP without additional assistance. Therefore, the present invention contemplates an RSTP-like method in combination with a hardware-assisted rapid transport channel failure detection algorithm. In other words, in this embodiment the present invention contemplates applying the rapid transport channel detection algorithm to the RSTP to thereby achieve response time improvements that are otherwise not feasible using existing (BPDU) failure detection techniques. A ring topology with such functionality is referred to here as a resilient wireless packet ring (RWPR).

Figure 11:
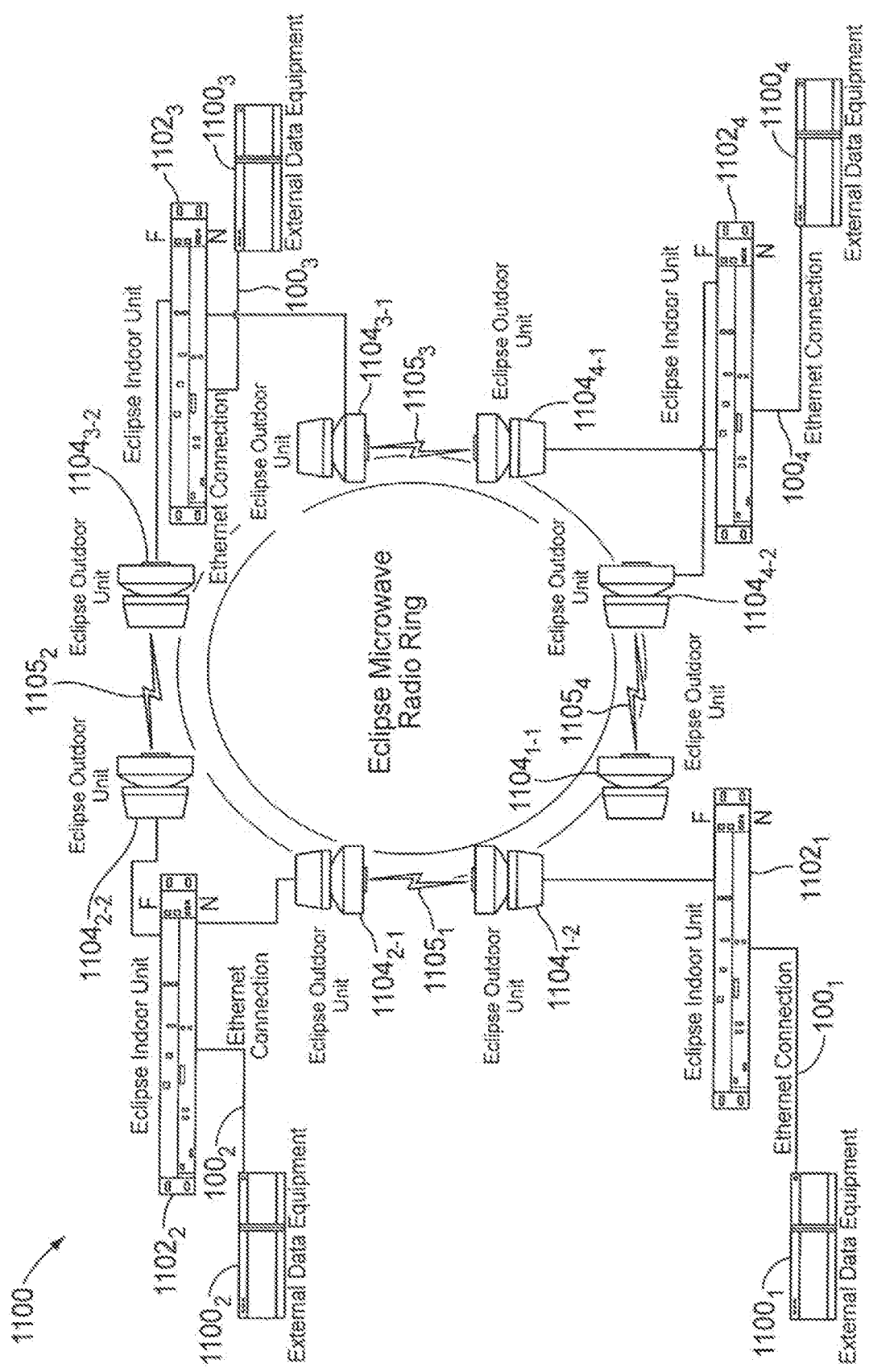
FIG. 11 is a resilient wireless packet ring network.

FIG. 11 provides the topology of a RWPR as implemented with Eclipse™ platform radios. A RWPR™-enabled Eclipse radio system is designed to detect the failure and switch the traffic flow without the use of external switches or routing devices in that it is designed to execute the RSTP directly in the DAC-GE. With the DAC-GE in each node 1102$_{1-4}$ providing a hardware-assisted algorithm as described above, the failure is detected faster than conventional designs. The failure detection time is reduced from seconds to hundreds of microseconds, and ring reconfiguration is communicated immediately to the participating RSTP nodes. This implementation makes it feasible to achieve the sub-50 ms failure convergence required by the carrier class Ethernet transport channel standard.

Indeed, the hardware-assisted failure detection over the wireless link (or set of links) 1105$_{1-4}$ is designed to behave equally well or better than the detection of a failure at the Ethernet physical layer. The failure detection by an active port in the network will trigger an immediate propagation of the failure information and a rapid transition in the port states and roles for all participating bridges (in this instance RSTP-enabled DAC-GEs) in the RWPR network. While failure detection and the associated network reconfiguration has a very demanding reaction time requirement for carrier class type of services, the requirement for restoration to the original network topology due to link restoration is not as demanding The processor present in the DAC-GE is responsible for the execution of the RSTP algorithm and will constantly monitor the transport channel link status. Because each DAC-GE functions as an RSTP-capable bridge, it communicates with other DAC-GEs in the network topology. When a failure is detected, the processor will simply apply the link status information to the RSTP algorithm without having to wait for the missing BPDUs (need not wait to determine loss of connection). Similarly, it will immediately (without waiting for the next hello-time interval) notify its neighbors about the failure and will proceed to evaluate and update its own port states and roles. The actions in a bridge that is not directly involved with the link failure detection will remain as defined by the RSTP standard (802.1w). These actions will effectively accelerate the convergence of the RSTP algorithm making it suitable for carrier class type of services.

Figure 12:
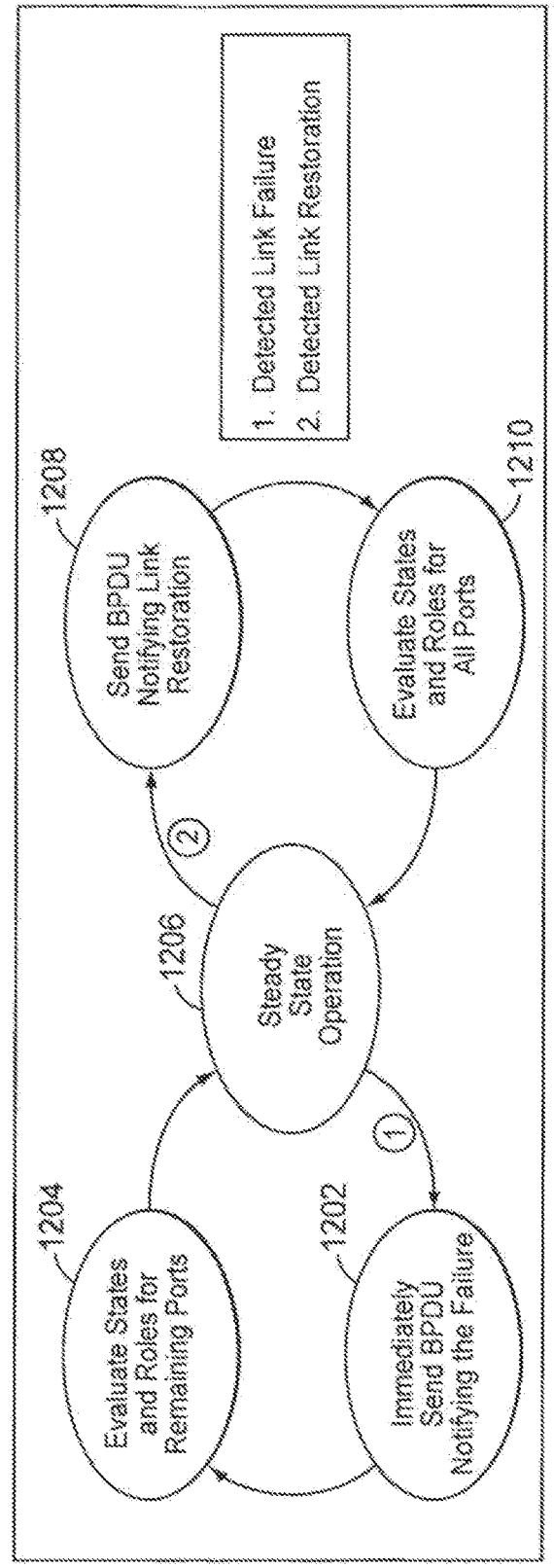
FIG. 12 is a state diagram of the link failure and restoration in the resilient wireless packet ring network.

FIG. 12 is a state diagram illustrating RWPR™ link failure and restoration executed by a bridge detecting a link failure in one of the active ports of the network topology. Additionally, the state diagram also shows the steps executed when a failed link is restored. It is important to mention that in some networks the original topology will not be restored after the detection of a link restoration.

In sum, although the present invention has been described in considerable detail with reference to certain preferred versions thereof, other versions and applications of the rapid transport failure detection algorithm and DAC-GE are possible. Therefore, the spirit and scope of the appended claims should not be limited to the description of the preferred versions contained herein.

The invention claimed is:

1. A network link recovery method comprising:
    receiving, by a first data transmission device, a first packet transmitted from a second data transmission device over a wireless network link;

determining, by the first data transmission device based on the first packet received, a negative receive status for the wireless network link;

sending, by the first data transmission device in response to determining the negative receive status for the wireless network link, a second packet to the second data transmission device, the second packet comprising a header that indicates the negative receive status, the indication of the negative receive status being configured to cause the second data transmission device to transmit packets with a header indicating the negative receive status;

receiving, by the first data transmission device, a sequence of packets transmitted from the second data transmission device over the wireless network link, each of the packets of the sequence of packets including a header comprising a cyclic redundancy check (CRC) value and indicating the negative receive status;

determining, by the first data transmission device, that a given number of consecutive ones of the packets of the sequence of packets comprise a header having a valid CRC value;

determining, by the first data transmission device in response to determining that a given number of consecutive ones of the packets of the sequence of packets comprise a header having a valid CRC value, a positive receive status for the wireless network link; and sending, by the first data transmission device in response to determining the positive receive status for the wireless network link, a third packet to the second data transmission device, the third packet comprising a header that indicates the positive receive status, the indication of the positive receive status being configured to cause the second data transmission device to transmit packets with a header indicating the positive receive status.

2. The method of claim 1, wherein determining the negative receive status for the wireless network link comprises determining a traffic alignment error related to payload traffic of the wireless network link.

3. The method of claim 1, wherein determining the negative receive status for the wireless network link comprises determining a packet received timeout related to payload traffic of the wireless network link.

4. The method of claim 1, wherein determining the negative receive status for the wireless network link comprises determining a CRC threshold related to payload traffic of the wireless network link has been met or exceeded.

5. The method of claim 1, wherein the first data transmission device is one of a plurality of wireless network nodes in a wireless network ring.

6. The method of claim 1, wherein the given number is a preconfigured CRC validation threshold number.

7. The method of claim 1, further comprising performing link aggregation.

8. A network data transmission device comprising:
a network interface configured to receive packets via a wireless network link; and
circuitry configured to perform the following operations:
receiving, by a first data transmission device via the network interface, a first packet transmitted from a second data transmission device over a wireless network link;
determining, based on the first packet received, a negative receive status for the wireless network link;
sending, in response to determining the negative receive status for the wireless network link, a second packet to the second data transmission device, the second packet comprising a header that indicates the negative receive status, the indication of the negative receive status being configured to cause the second data transmission device to transmit packets with a header indicating the negative receive status;

receiving a sequence of packets transmitted from the second data transmission device over the wireless network link, each of the packets of the sequence of packets including a header comprising a cyclic redundancy check (CRC) value and indicating the negative receive status;

determining that a given number of consecutive ones of the packets of the sequence of packets comprise a header having a valid CRC value;

determining, in response to determining that a given number of consecutive ones of the packets of the sequence of packets comprise a header having a valid CRC value, a positive receive status for the wireless network link; and sending, in response to determining the positive receive status for the wireless network link, a third packet to the second data transmission device, the third packet comprising a header that indicates the positive receive status, the indication of the positive receive status being configured to cause the second data transmission device to transmit packets with a header indicating the positive receive status.

9. The device of claim 8, wherein determining the negative receive status for the wireless network link comprises determining a traffic alignment error related to payload traffic of the wireless network link.

10. The device of claim 8, wherein determining the negative receive status for the wireless network link comprises determining a packet received timeout related to payload traffic of the wireless network link.

11. The device of claim 8, wherein determining the negative receive status for the wireless network link comprises determining a CRC threshold related to payload traffic of the wireless network link has been met or exceeded.

12. The device of claim 8, wherein the first data transmission device is one of a plurality of wireless network nodes in a wireless network ring.

13. The device of claim 8, wherein the given number is a preconfigured CRC validation threshold number.

14. The device of claim 8, the operations further comprising performing link aggregation.

15. A network data transmission device comprising:
circuitry configured to perform the following operations:
receiving, by a first data transmission device via a network interface, a first packet transmitted from a second data transmission device over a wireless network link;
determining, based on the first packet received, a negative receive status for the wireless network link;
sending, in response to determining the negative receive status for the wireless network link, a second packet to the second data transmission device, the second packet comprising a header that indicates the negative receive status, the indication of the negative receive status being configured to cause the second data transmission device to transmit packets with a header indicating the negative receive status;

receiving a sequence of packets transmitted from the second data transmission device over the wireless network link, each of the packets of the sequence of packets including a header comprising a cyclic redundancy check (CRC) value and indicating the negative receive status;

determining that a given number of consecutive ones of the packets of the sequence of packets comprise a header having a valid CRC value;

determining, in response to determining that a given number of consecutive ones of the packets of the sequence of packets comprise a header having a valid CRC value, a positive receive status for the wireless network link; and sending, in response to determining the positive receive status for the wireless network link, a third packet to the second data transmission device, the third packet comprising a header that indicates the positive receive status, the indication of the positive receive status being configured to cause the second data transmission device to transmit packets with a header indicating the positive receive status.

16. The device of claim 15, wherein determining the negative receive status for the wireless network link comprises determining a traffic alignment error related to payload traffic of the wireless network link.

17. The device of claim 15, wherein determining the negative receive status for the wireless network link comprises determining a packet received timeout related to payload traffic of the wireless network link.

18. The device of claim 15, wherein determining the negative receive status for the wireless network link comprises determining a CRC threshold related to payload traffic of the wireless network link has been met or exceeded.

19. The device of claim 15, wherein the first data transmission device is one of a plurality of wireless network nodes in a wireless network ring.

20. The device of claim 15, wherein the given number is a preconfigured CRC validation threshold number.

* * * * *